(12) United States Patent
Juang et al.

(10) Patent No.: US 10,656,184 B1
(45) Date of Patent: May 19, 2020

(54) SIGNAL PROCESS CIRCUIT CAPABLE OF BEING EXTERNALLY COUPLED TO MULTIPLE TYPES OF AMPLIFIER CIRCUITS

(71) Applicants: Ying-Zong Juang, Hsinchu (TW);
Hann-Huei Tsai, Hsinchu (TW);
Po-Chang Wu, Hsinchu (TW);
Yu-Chen Liu, Hsinchu (TW);
Chih-Yuan Yeh, Hsinchu (TW)

(72) Inventors: Ying-Zong Juang, Hsinchu (TW);
Hann-Huei Tsai, Hsinchu (TW);
Po-Chang Wu, Hsinchu (TW);
Yu-Chen Liu, Hsinchu (TW);
Chih-Yuan Yeh, Hsinchu (TW)

(73) Assignee: NATIONAL APPLIED RESEARCH LABORATORIES, Hsinchu (TW)

( * ) Notice: Subject to any disclaimer, the term of this patent is extended or adjusted under 35 U.S.C. 154(b) by 0 days.

(21) Appl. No.: 16/426,011

(22) Filed: May 30, 2019

(30) Foreign Application Priority Data

Feb. 12, 2019 (TW) .............................. 108104677 A

(51) Int. Cl.
*G01R 15/14* (2006.01)
*H03F 3/45* (2006.01)
*G01R 1/20* (2006.01)
*H03F 3/393* (2006.01)
*G01R 19/00* (2006.01)

(52) U.S. Cl.
CPC ........... *G01R 15/146* (2013.01); *G01R 1/203* (2013.01); *G01R 19/0092* (2013.01); *H03F 3/393* (2013.01); *H03F 3/45928* (2013.01); *H03F 2200/462* (2013.01); *H03F 2200/481* (2013.01)

(58) Field of Classification Search
CPC ............... H03F 3/393; H03F 2200/462; H03F 2200/481; G01R 19/0092; G01R 15/146; G01R 1/203; G01R 19/0023; G01R 1/30; G11C 7/06; G11C 7/062; G11C 7/08; H03K 5/08
See application file for complete search history.

(56) References Cited

U.S. PATENT DOCUMENTS

| | | | |
|---|---|---|---|
| 6,734,723 B2 | 5/2004 | Huijsing et al. | |
| 8,648,623 B2 * | 2/2014 | Liu ..................... | H03F 3/45179 327/51 |
| 8,797,104 B2 | 8/2014 | Hsieh et al. | |
| 9,632,111 B2 * | 4/2017 | Bogner ................. | G01R 1/203 |
| 10,164,481 B2 * | 12/2018 | Piasecki .............. | H03F 3/45475 |
| 2018/0088152 A1 * | 3/2018 | Wang ....................... | G01R 1/30 |

\* cited by examiner

*Primary Examiner* — Ryan Johnson

(57) ABSTRACT

A signal process circuit includes a signal modulation unit, a first resistor, a second resistor, a first discharge unit, a second discharge unit and a discharge detection unit. The signal modulation unit is used to modulate an input signal for generating a modulated signal. The first resistor is coupled between the signal modulation unit and an operation node. The second resistor is coupled between the operation node and the signal modulation unit. The first discharge unit is coupled to the signal modulation unit. The discharge unit is coupled to the signal modulation unit. The discharge detection unit is coupled to the first discharge unit, the operation node and the second discharge unit for detecting an output common voltage and control a discharge path accordingly.

12 Claims, 3 Drawing Sheets

minal of the second discharge unit, and a fifth detection terminal coupled to the fourth terminal of the second discharge unit.

SIGNAL PROCESS CIRCUIT CAPABLE OF BEING EXTERNALLY COUPLED TO MULTIPLE TYPES OF AMPLIFIER CIRCUITS

TECHNICAL FIELD

The disclosure relates to a signal process circuit, and more particularly, a signal process circuit which is capable of being externally coupled to multiple types of amplifier circuits, supporting switching of high speed discharge, and reducing usage of high voltage components.

BACKGROUND

According to prior art, a high voltage current shunt amplifier and related process circuit may be used in application scenarios of real-time overcurrent protection (OCP), current and power protection of system optimization, current measurement for a closed loop circuit and so on. For example, in the fields of robotics, electric vehicle (EV), hybrid electric vehicle (HEV) and solar inverter, the above-mentioned circuit is frequently used. In practice, information can be carried on a signal having a pulse width modulation (PWM) waveform. However, regarding circuits of the field, there are engineering problems including that input common voltages of various amplifiers vary too greatly, an amplifier is susceptible to changes of a pulse width modulation signal, and it is difficult to avoid using high voltage components. The engineering problems have caused difficulties of circuit design in the field. An appropriate solution is still required.

SUMMARY

An embodiment provides a signal process circuit including a signal modulation unit, a first resistor, a second resistor, a first discharge unit, a second discharge unit and a discharge detection unit. The signal modulation unit is used to modulate an input signal for generating a modulated signal. The signal modulation unit includes a first input terminal, a second input terminal, a first output terminal and a second output terminal wherein the first input terminal and the second input terminal of the signal modulation unit are configured to receive the input signal, and the first output terminal and the second output terminal of the signal modulation unit are configured to output the modulated signal. The first resistor includes a first terminal coupled to the first output terminal of the signal modulation unit, and a second terminal coupled to an operation node. The second resistor includes a first terminal coupled to the operation mode, and a second terminal coupled to the second output terminal of the signal modulation unit. The first discharge unit includes a first terminal coupled to the first output terminal of the signal modulation unit, a second terminal coupled to the second output terminal of the signal modulation unit, a third terminal, and a fourth terminal. The second discharge unit includes a first terminal coupled to the first output terminal of the signal modulation unit, a second terminal coupled to the second output terminal of the signal modulation unit, a third terminal, and a fourth terminal. The discharge detection unit includes a first detection terminal coupled to the third terminal of the first discharge unit, a second detection terminal coupled to the fourth terminal of the first discharge unit, a third detection terminal coupled to the operation node, a fourth detection terminal coupled to the third ter-

DETAILED DESCRIPTION

Figure 1:
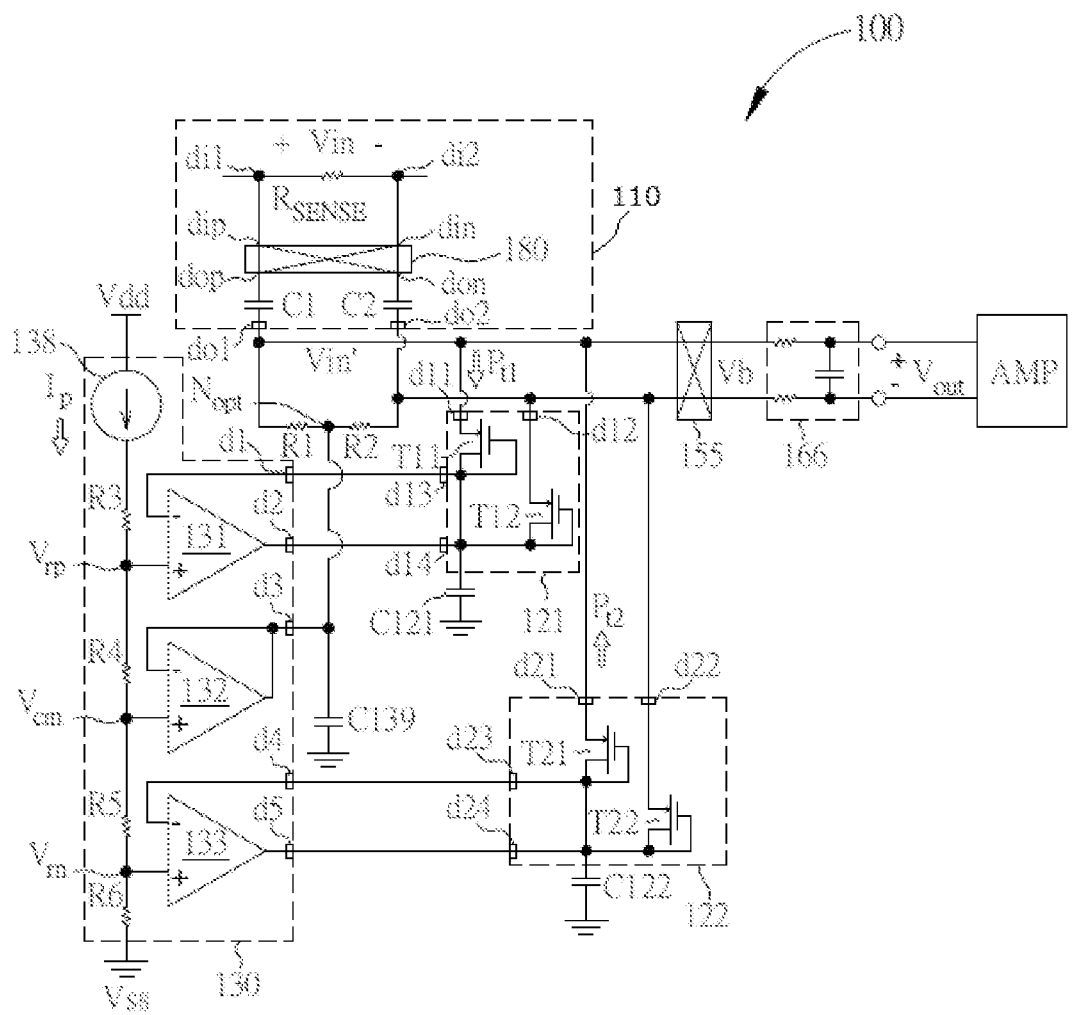
FIG. 1 illustrates a signal process circuit coupled to a post amplifier according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a signal process circuit 100 coupled to a post amplifier AMP according to an embodiment. The signal process circuit 100 may be a high voltage (HV) interface circuit used to provide stable signals to the post amplifier AMP to perform amplification operations. The signal process circuit 100 may include a signal modulation unit 110, a first resistor R1, a second resistor R2, a first discharge unit 121, a second discharge unit 122 and a discharge detection unit 130.

The signal modulation unit 110 may be used modulate an input signal Vin for generating a modulated signal Vin'. The signal modulation unit 110 may include a first input terminal di1, a second input terminal di2, a first output terminal do1 and a second output terminal do2 wherein the first input terminal di1 and the second input terminal di2 may be used to receive the input signal Vin, and the first output terminal do1 and the second output terminal do2 may be used to output the modulated signal Vin'. The details of the signal modulation unit 110 will be further described below.

The first resistor R1 may include a first terminal and a second terminal where the first terminal is coupled to the first output terminal do1 of the signal modulation unit 110, and the second terminal is coupled to an operation node Nopt. The second resistor R2 may include a first terminal coupled to the operation node Nopt, and a second terminal coupled to the second output terminal do2 of the signal modulation unit 110.

The first discharge unit 110 may include a first terminal d11, a second terminal d12, a third terminal d13 and a fourth terminal d14 where the first terminal d11 is coupled to the first output terminal do1 of the signal modulation unit 110, the second terminal d12 is coupled to the second output terminal do2 of the signal modulation unit 110.

The second discharge unit 122 may include a first terminal d21, a second terminal d22, a third terminal d23 and a fourth terminal d24 where the first terminal d21 is coupled to the first output terminal do1 of the signal modulation unit 110, a second terminal d22 is coupled to the second output terminal do2 of the signal modulation unit 110.

The discharge detection unit 130 may include a first detection terminal d1 to a fifth detection terminal d5, where the first detection terminal d1 is coupled to the third terminal d12 of the first discharge unit 121, the second detection terminal d2 is coupled to the fourth terminal d14 of the first discharge unit 121, the third detection terminal d3 is coupled to the operation node Nopt, the fourth detection terminal d14 is coupled to the third terminal d23 of the second discharge unit 122, and the fifth detection terminal d5 is coupled to the fourth terminal d24 of the second discharge unit 122.

According to an embodiment, the input signal Vin may be carried on an input common voltage, and the modulated signal Vin' may be carried on an output common voltage. According to an embodiment, for example, the input common voltage may be between −4 to 70 volts. The output common voltage may be a half value of a supply voltage V_supply and be, for example, 1.25 to 2.75 volts. When the output common voltage is higher than an upper threshold voltage Vrp, the first discharge unit 121 may be turned on for providing a first discharge path Pt1. When the output common voltage is lower than a lower threshold voltage Vrn, the second discharge unit 122 may be turned on for providing a second discharge path Pt2.

According to an embodiment, as shown in FIG. 1, the discharge detection unit 130 may further include a first differential buffer 131, a second differential buffer 132 and a third differential buffer 133 as described below.

The first differential buffer 131 may include a negative terminal, a positive terminal and an output terminal where the negative terminal is coupled to the first detection terminal d1 of the discharge detection unit 130, the positive terminal is used to receive the upper threshold voltage Vrp, and the output terminal is coupled to the second detection terminal d2 of the discharge detection unit 130.

The second differential buffer 132 may include a negative terminal, a positive terminal and an output terminal where the negative terminal is coupled to the third detection terminal d3 of the discharge detection unit 130, a positive terminal may be used to receive an intermediary voltage Vcm, and the output terminal is coupled to the third detection terminal d3 of the discharge detection unit 130. For example, the said intermediary voltage Vcm may be an input common voltage of the post amplifier AMP which is coupled to the signal process circuit 100.

The third differential buffer 133 may include a negative terminal, a positive terminal and an output terminal where the negative terminal is coupled to the fourth detection terminal d4 of the discharge detection unit 130, the positive terminal is used to receive the lower threshold voltage Vrn, and the output terminal is coupled to the fifth detection terminal d5 of the discharge detection unit 130.

For example, the upper threshold voltage Vrp may be (but not limited to) 2.7 volts, the intermediary voltage Vcm may be (but not limited to) 2.5 volts, and the lower threshold voltage Vrn may be (but not limited to) 2.3 volts. By detecting and monitoring the voltages, a discharge path may be provided at the right time to quickly remove electrical charge for avoid instability caused by transient changes of the pulse width modulation signal. According to an embodiment, each of the first differential buffer 131 to the third differential buffer 133 may be (but not limited to) a class According to an embodiment, as shown in FIG. 1, the discharge detection unit 130 may further include a current source 138, a third resistor R3, a fourth resistor R4, a fifth resistor R5 and a sixth resistor R6. The current source 138 may be used to provide an operation current Ip, and include a first terminal and a second terminal where the first terminal is used to receive a first reference voltage Vdd. The first reference voltage Vdd may be (but not limited to) 5 volts. The third resistor R3 may include a first terminal and a second terminal where the first terminal is coupled to the second terminal of the current source 138, and the second terminal coupled to the positive terminal of the first differential buffer 131. The fourth resistor R4 may include a first terminal and a second terminal where the first terminal is coupled to the second terminal of the third resistor R3, and a second terminal is coupled to the positive terminal of the second differential buffer 132. The fifth resistor R5 may include a first terminal and a second terminal where the first terminal is coupled to the second terminal of the fourth resistor R4, and the second terminal is coupled to the positive terminal of the third differential buffer 133. The sixth resistor R6 may include a first terminal and a second terminal where the first terminal is coupled to the second terminal of the fifth resistor R5, and the second terminal is used to receive a second reference voltage Vss. The second reference voltage Vss may be (but not limited to) a ground voltage. The intermediary Vcm may be (but not limited to) substantially half of the first reference voltage Vdd.

According to an embodiment, as shown in FIG. 1, the first discharge unit 121 may include a first transistor T11 and a second transistor T12. The first transistor T11 may include a first terminal, a second terminal and a control terminal where the first terminal is coupled to the first terminal d11 of the first discharge unit 121, the second terminal is coupled to the third terminal d13 and the fourth terminal d14 of the first discharge unit 121, and the control terminal is coupled to the second terminal of the first transistor T11. The second transistor T12 may include a first terminal, a second terminal and a control terminal where the first terminal is coupled to the second terminal d12 of the first discharge unit 121, the second terminal coupled to the second terminal of the first transistor T11, and the control terminal is coupled to the second terminal of the first transistor T11. For example, each of the first transistor T11 and the second transistor T12 may be a p-type metal oxide semiconductor (PMOS) transistor where a first terminal may be a source terminal, a second terminal may be a drain terminal and a control terminal may be a gate terminal.

According to an embodiment, as shown in FIG. 1, the second discharge unit 122 may include a third transistor T21 and a fourth transistor T22. The third transistor T21 may include a first terminal, a second terminal and a control terminal where the first terminal is coupled to the first terminal d21 of the second discharge unit 122, the second terminal coupled to the third terminal d23 and the fourth terminal d24 of the second discharge unit 122, and the control terminal is coupled to the second terminal of the third transistor T21. The fourth transistor T22 may include a first terminal, a second terminal and a control terminal where the first terminal is coupled to the second terminal d22 of the second discharge unit 122, the second terminal is coupled to the second terminal of the third transistor T21, and the control terminal coupled to the second terminal of the third transistor T21. For example, each of the first transistor T21 and the second transistor T22 may be an n-type metal oxide semiconductor (NMOS) transistor where a first terminal may be a drain terminal, a second terminal may be a source terminal and a control terminal may be a gate terminal.

The circuit structures of the first discharge unit 121 and the second discharge unit 122 may be merely examples. According to an embodiment, suitable diodes may be used to replace the transistors for providing discharge paths. As shown in FIG. 1, the second terminal of the first transistor T11 may be optionally coupled to a capacitor C121. The second terminal of the transistor T21 may be optionally coupled to a capacitor C122. The operation node Nopt may be optionally coupled to a capacitor C139 for blocking unwanted portions of signals.

According to an embodiment, as shown in FIG. 1, the signal process circuit 100 may further include a signal demodulation unit 155 and a low pass filter 166. The signal demodulation unit 155 may be used to demodulate the carried modulated signal Vin' to generate a baseband signal Vb. The signal demodulation unit 155 may include a first input terminal, a second input terminal, a first output terminal and a fourth output terminal where the first input terminal of the signal demodulation unit 155 is coupled to the first output terminal do1 of the signal modulation unit 110, and the second input terminal of the signal demodulation unit 155 is coupled to the second output terminal do2 of the signal modulation unit 110. The first output terminal and the second output terminal of the signal demodulation unit 155 may be used to output the baseband signal Vb.

According to an embodiment, a low pass filter 166 may be used to perform signal filtering on the baseband signal Vb to generate an output signal Vout. The low pass filter 166 may include a first input terminal, a second input terminal, a first output terminal and a second output terminal. The first input terminal of the low pass filter 166 may be coupled to the first output terminal of the signal demodulation unit 155. The second input terminal of the low pass filter 166 may be coupled to the second output terminal of the signal demodulation unit 155. The first output terminal and the second output terminal of the low pass filter 166 may be used to output the output signal Vout. In FIG. 1, the low pass filter 166 includes two resistors and one capacitor as an example to describe that the low pass filter 166 may include a set of resistor(s) and capacitor(s). However, the low pass filter 166 in FIG. 1 is merely an example instead of limiting the structure of the low pass filter 166.

The output signal Vout outputted from the first output terminal and the second output terminal of the low pass filter 166 may be provided to the post amplifier AMP. According to an embodiment, the said post amplifier AMP may be one of multiple sorts of amplifies such as class A amplifier, current feedback instrumentation amplifier (CFIA), 3 op amp instrumentation amplifier and another low voltage operation amplifier.

Regarding the signal modulation unit 110, the signal modulation unit 110 may further include a detection resistor RSENSE, a chopper switch circuit 180, a first capacitor C1 and a second capacitor C2. The detection resistor RSENSE may be coupled between the first input terminal di1 and the second input terminal di2 of the signal modulation unit 110. The chopper switch circuit 180 may be used to perform a chopper operation on the input signal Vin. The chopper switch circuit 180 may include a first input terminal dip, a second input terminal din, a first output terminal dop and a second output terminal don. The first input terminal dip may be coupled to the first input terminal di1 of the signal modulation unit 110, and the second input terminal din may be coupled to the second input terminal di2 of the signal modulation unit 110. The first capacitor C1 may be coupled between the first output terminal dop of the chopper switch circuit 180 and the first output terminal do1 of the signal modulation unit 110 for performing direct-current blocking (DC blocking). The second capacitor C2 may be coupled between the second output terminal don of the chopper switch circuit 180 and the second output terminal do2 of the signal modulation unit 110 for performing direct-current blocking. The signal modulation unit 110 may modulate the input signal Vin to generate a high frequency alternating current (AC) signal which is the modulated signal Vin'. The modulated signal Vin' may correspond to information which is intended to be transferred, processed and amplified. Capacitors being substantially of a same kind and a same capacitance may be selected to be the first capacitor C1 and the second capacitor C2.

Figure 2:
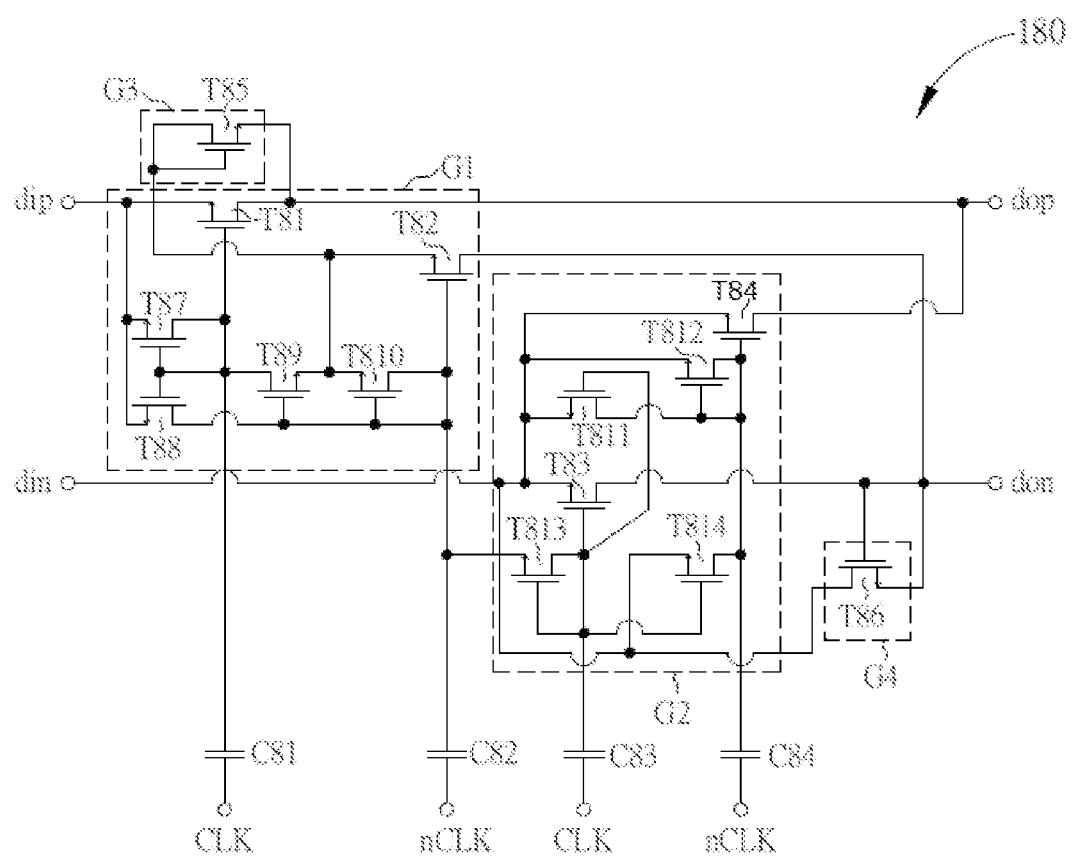
FIG. 2 illustrates a circuit diagram of the chopper switch circuit of FIG. 1 according to an embodiment.

FIG. 2 illustrates a circuit diagram of the chopper switch circuit 180 of FIG. 1 according to an embodiment. According to an embodiment, the chopper switch circuit 180 may include transistors T81, T82, T83, T84, T85, T86, T87, T88, T89, T80, T811, T812, T813 and T814 where each transistor may include a first terminal, a second terminal and a control terminal. According to an embodiment, the transistors T81 to T814 may be (but not limited to) NMOS transistors, where in each transistor, a first terminal may be a drain terminal, a second terminal may be a source terminal, and a control terminal may be a gate terminal. The circuit configuration related to the transistors of the chopper switch circuit 180 may be described below.

As shown in FIG. 2, the transistor T81 may include a first terminal coupled to the first output terminal dop of the chopper switch circuit 180, a second terminal coupled to the first input terminal dip of the chopper switch circuit 180, and a control terminal used to receive a first clock signal CLK. The transistor T82 may include a first terminal coupled to the second output terminal don, a second terminal coupled to the first input terminal dip, and a control terminal used to receive a second clock signal nCLK. The transistor T83 may include a first terminal coupled to the second output terminal don, a second terminal coupled to the second input terminal din, and a control terminal used to receive the first clock signal CLK. The transistor T84 may include a first terminal coupled to the first output terminal dop, a second terminal coupled to the second input terminal din, and a control terminal used to receive the second clock signal nCLK. The transistor T85 may include a first terminal coupled to the first input terminal dip, a second terminal coupled to the first output terminal dop, and a control terminal coupled to the first terminal of the transistor T85. The transistor T86 may include a first terminal coupled to the second input terminal din, a second terminal coupled to the second output terminal don, and a control terminal coupled to the second output terminal don. The transistor T88 may include a first terminal used to receive the second clock signal nCLK, a second terminal coupled to the first input terminal dip, and a control terminal used to receive the first clock signal CLK. The transistor T89 may include a first terminal used to receive the first clock signal CLK, a second terminal coupled to the first input terminal dip, and a control terminal used to receive the second clock signal nCLK. The transistor T811 may include a first terminal used to receive the second clock signal nCLK, a second terminal coupled to the second input terminal din, and a control terminal used to receive the first clock signal CLK. The transistor T814 comprising a first terminal used to receive the second clock signal nCLK, a second terminal coupled to the second input terminal din, and a control terminal used to receive the first clock signal CLK. The transistor T87 may include a first terminal used to receive the first clock signal CLK, a second terminal coupled to the first input terminal dip, and a control terminal used to receive the first clock signal CLK. The transistor T810 may include a first terminal used to receive the second cloak signal nCLK, a second terminal coupled to the first input terminal dip, and a control terminal used to receive the second clock signal nCLK. The transistor T812 may include a first terminal used to receive the second cloak signal nCLK, a second terminal coupled to the second input terminal din, and a control terminal used to receive the second clock signal nCLK. The transistor T813 may include a first terminal used to receive the first cloak signal CLK, a second terminal used to receive the second clock signal nCLK, and a control terminal configured to receive the first clock signal CLK. The first clock signal CLK and the second clock signal nCLK mentioned above may substantially be (but not limited to) two signals in antiphase with one another.

Figure 3:
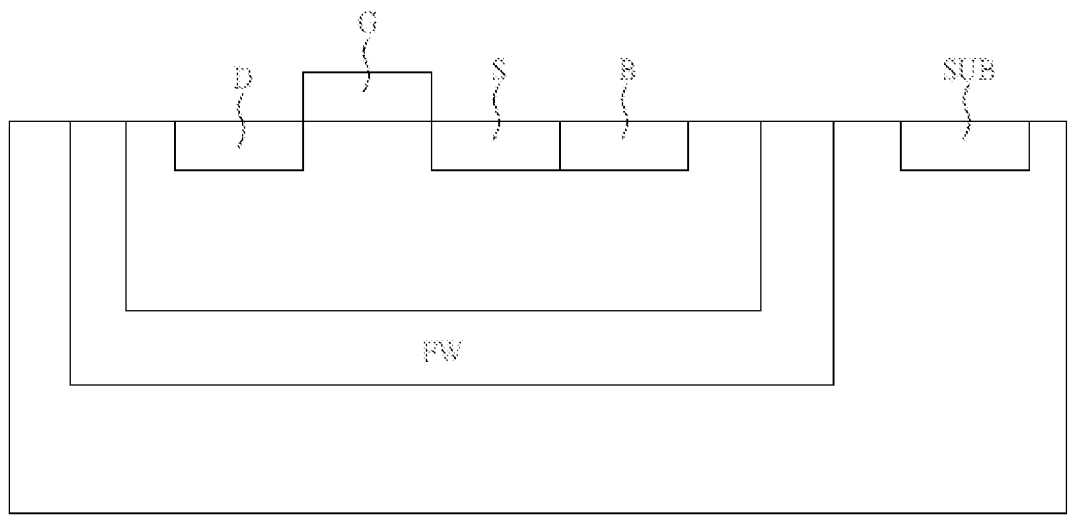
FIG. 3 illustrates a structure of a transistor formed at a floating well according to an embodiment.

As shown in FIG. 2, the transistors T81, T82, T87, T88, T89 and T810 may be included by a first group G1. The transistors T83, T84, T811, T812, T813 and T814 may be included by a second group G2. The transistor T85 may be included by a third group G3. The transistor T86 may be included by a fourth group G4. According to an embodiment, the transistors in FIG. 2 may be transistors formed at floating wells with a structure shown in FIG. 3. FIG. 3 illustrates a structure of a transistor formed at a floating well according to an embodiment. In FIG. 3, a drain terminal D, a gate terminal G and a source terminal S may be formed at a floating well FW. A body terminal B and a terminal SUB coupled to a substrate may be further included by the structure. As shown in FIG. 2 with referring to FIG. 3, the transistors of the first group G1 may be formed at a first floating well, the transistors of the second group G2 may be formed at a second floating well, the transistor of the third group G3 may be formed at a third floating well, and the transistor of the fourth group G4 may be formed at a fourth floating well. By means of a transistor formed at a floating well, a floating well structure may be used for withstanding a high voltage. For example, the high voltage may be (but not limited to) 70 volts. It may be avoided to use a high voltage transistor, so excessive circuit area may be effectively avoided. The circuit structure in FIG. 2 is merely an example. According to an embodiment, a transistor may be replaced using a suitable diode for an effect of claiming and fixing a voltage difference. As shown in FIG. 2, capacitors C81, C82, C83 and/or C84 may be optionally coupled for blocking unneeded portion of signals. According to an embodiment, by means of the transistors T85, T86, T88, T89, T811 and T814, the chopper switch circuit 180 may be able to recover from the influence caused by transient changes of the pulse width modulation signal. For example, by means of the structure of FIG. 2, the time required for recovering from a transient state may be as short as 3 microseconds (μsec). However, without using the circuit provided by an embodiment, the time required for recovering from a transient state may be as long as tens of microseconds. Hence, the circuit structure provided by an embodiment is advantageous to signal quality.

In summary, by means of a circuit provided by an embodiment, a structure (e.g. the signal modulation unit 110) having modulation switches designed on floating wells and high voltage capacitors may be used, so a DC common input voltage (e.g. −20 to 70 volts) may be blocked, and small AC signals may pass through. The high voltage capacitors may block DC signals, so the structure may have a very low input bias current. As mentioned above, the usage of high voltage components may be avoided. The post amplifier AMP coupled to the low pass filter 166 may compatibly be one of multiple kinds of operation amplifiers of various input voltages. A circuit provided by an embodiment may have improved PWM rejection ability and high-speed recovery ability. Because a chopper switch circuit may have high-speed discharge paths, so the requirement of high-frequency (e.g. 100 kilohertz) pulse width modulation operation may be fulfilled. The high-speed discharge paths may be used to speed up removing the static electrical charges, where the static electrical charges are stored in high voltage capacitors when the common voltage switches. Hence, an amplifier may recover to normally output signals within a short time interval (e.g. 3 microseconds). As a result, the disclosure is useful for reducing the engineering problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal process circuit comprising
a signal modulation unit configured to modulate an input signal for generating a modulated signal, the signal modulation unit comprising a first input terminal, a second input terminal, a first output terminal and a second output terminal wherein the first input terminal and the second input terminal of the signal modulation unit are configured to receive the input signal, and the first output terminal and the second output terminal of the signal modulation unit are configured to output the modulated signal;
a first resistor comprising a first terminal coupled to the first output terminal of the signal modulation unit, and a second terminal coupled to an operation node;
a second resistor comprising a first terminal coupled to the operation mode, and a second terminal coupled to the second output terminal of the signal modulation unit;
a first discharge unit comprising a first terminal coupled to the first output terminal of the signal modulation unit, a second terminal coupled to the second output terminal of the signal modulation unit, a third terminal, and a fourth terminal;
a second discharge unit comprising a first terminal coupled to the first output terminal of the signal modulation unit, a second terminal coupled to the second output terminal of the signal modulation unit, a third terminal, and a fourth terminal; and
a discharge detection unit comprising a first detection terminal coupled to the third terminal of the first discharge unit, a second detection terminal coupled to the fourth terminal of the first discharge unit, a third detection terminal coupled to the operation node, a fourth detection terminal coupled to the third terminal of the second discharge unit, and a fifth detection terminal coupled to the fourth terminal of the second discharge unit.

2. The signal process circuit of claim 1, wherein the input signal is carried on an input common voltage, the modulated signal is carried on an output common voltage, and the first discharge unit is turned on for providing a first discharge path when the output common voltage is higher than an upper threshold voltage.

3. The signal process circuit of claim 2, wherein the second discharge unit is turned on for providing a second discharge path when the output common voltage is lower than a lower threshold voltage.

4. The signal process circuit of claim 2, wherein the discharge detection unit further comprises:
a first differential buffer comprising a negative terminal coupled to the first detection terminal of the discharge detection unit, a positive terminal configured to receive the upper threshold voltage, and an output terminal coupled to the second detection terminal of the discharge detection unit;

a second differential buffer comprising a negative terminal coupled to the third detection terminal of the discharge detection unit, a positive terminal configured to receive an intermediary voltage, and an output terminal coupled to the third detection terminal of the discharge detection unit; and a third differential buffer comprising a negative terminal coupled to the fourth detection terminal of the discharge detection unit, a positive terminal configured to receive the lower threshold voltage, and an output terminal coupled to the fifth detection terminal of the discharge detection unit.

5. The signal process circuit of claim 4, wherein the discharge detection unit further comprises:

a current source configured to provide an operation current, and comprising a first terminal configured to receive a first reference voltage, and a second terminal;

a third resistor comprising a first terminal coupled to the second terminal of the current source, and a second terminal coupled to the positive terminal of the first differential buffer;

a fourth resistor comprising a first terminal coupled to the second terminal of the third resistor, and a second terminal coupled to the positive terminal of the second differential buffer;

a fifth resistor comprising a first terminal coupled to the second terminal of the fourth resistor, and a second terminal coupled to the positive terminal of the third differential buffer; and a sixth resistor comprising a first terminal coupled to the second terminal of the fifth resistor, and a second terminal configured to receive a second reference voltage;

wherein the intermediary voltage is substantially half of the first reference voltage.

6. The signal process circuit of claim 1, wherein the first discharge unit further comprises:

a first transistor comprising a first terminal coupled to the first terminal of the first discharge unit, a second terminal coupled to the third terminal and the fourth terminal of the first discharge unit, and a control terminal coupled to the second terminal of the first transistor; and a second transistor comprising a first terminal coupled to the second terminal of the first discharge unit, a second terminal coupled to the second terminal of the first transistor, and a control terminal coupled to the second terminal of the first transistor.

7. The signal process circuit of claim 1, wherein the second discharge unit further comprises:

a third transistor comprising a first terminal coupled to the first terminal of the second discharge unit, a second terminal coupled to the third terminal and the fourth terminal of the second discharge unit, and a control terminal coupled to the second terminal of the third transistor; and a fourth transistor comprising a first terminal coupled to the second terminal of the second discharge unit, a second terminal coupled to the second terminal of the third transistor, and a control terminal coupled to the second terminal of the third transistor.

8. The signal process circuit of claim 1, further comprising:

a signal demodulation unit configured to demodulate the modulated signal to generate a baseband signal, and comprising a first input terminal coupled to the first output terminal of the signal modulation unit, a second input terminal coupled to the second output terminal of the signal modulation unit, a first output terminal, and a second output terminal, wherein the first output terminal and the second output terminal of the signal demodulation unit are configured to output the baseband signal; and a low pass filter configured to perform signal filtering on the baseband signal to generate an output signal, and comprising a first input terminal coupled to the first output terminal of the signal demodulation unit, a second input terminal coupled to the second output terminal of the signal demodulation unit, a first output terminal, and a second output terminal, wherein the first output terminal and the second output terminal of the low pass filter are configured to output the output signal.

9. The signal process circuit of claim 1, wherein the signal modulation unit further comprises:

a detection resistor coupled between the first input terminal and the second input terminal of the signal modulation unit;

a chopper switch circuit configured to perform a chopper operation on the input signal, and comprising a first input terminal coupled to the first input terminal of the signal modulation unit, a second input terminal coupled to the second input terminal of the signal modulation unit, a first output terminal, and a second output terminal;

a first capacitor coupled between the first output terminal of the chopper switch circuit and the first output terminal of the signal modulation unit, and configured to perform direct-current blocking; and a second capacitor coupled between the second output terminal of the chopper switch circuit and the second output terminal of the signal modulation unit, and configured to perform direct-current blocking.

10. The signal process circuit of claim 9, wherein the chopper switch circuit further comprises:

a first transistor comprising a first terminal coupled to the first output terminal of the chopper switch circuit, a second terminal coupled to the first input terminal of the chopper switch circuit, and a control terminal configured to receive a first clock signal;

a second transistor comprising a first terminal coupled to the second output terminal of the chopper switch circuit, a second terminal coupled to the first input terminal of the chopper switch circuit, and a control terminal configured to receive a second clock signal;

a third transistor comprising a first terminal coupled to the second output terminal of the chopper switch unit, a second terminal coupled to the second input terminal of the chopper switch circuit, and a control terminal configured to receive the first clock signal;

a fourth transistor comprising a first terminal coupled to the first output terminal of the chopper switch circuit, a second terminal coupled to the second input terminal of the chopper switch circuit, and a control terminal configured to receive the second clock signal;

a fifth transistor comprising a first terminal coupled to the first input terminal of the chopper switch circuit, a second terminal coupled to the first output terminal of the chopper switch circuit, and a control terminal coupled to the first terminal of the fifth transistor;

a sixth transistor comprising a first terminal coupled to the second input terminal of the chopper switch circuit, a second terminal coupled to the second output terminal of the chopper switch circuit, and a control terminal coupled to the second output terminal of the chopper switch circuit;

a seventh transistor comprising a first terminal configured to receive the second clock signal, a second terminal coupled to the first input terminal of the chopper switch circuit, and a control terminal configured to receive the first clock signal;

an eighth transistor comprising a first terminal configured to receive the first clock signal, a second terminal coupled to the first input terminal of the chopper switch circuit, and a control terminal configured to receive the second clock signal;

a ninth transistor comprising a first terminal configured to receive the second clock signal, a second terminal coupled to the second input terminal of the chopper switch circuit, and a control terminal configured to receive the first clock signal; and a tenth transistor comprising a first terminal configured to receive the second clock signal, a second terminal coupled to the second input terminal of the chopper switch circuit, and a control terminal configured to receive the first clock signal;

wherein the first clock signal and the second clock signal are in antiphase with one another.

11. The signal process circuit of claim 10, wherein:
the first transistor and the second transistor are formed at a first floating well;
the third transistor and the fourth transistor are formed at a second floating well;
the fifth transistor is formed at a third floating well; and
the sixth transistor is formed at a fourth floating well.

12. The signal process circuit of claim 10, wherein the chopper switch circuit further comprises:

an eleventh transistor comprising a first terminal configured to receive the first clock signal, a second terminal coupled to the first input terminal of the chopper switch circuit, and a control terminal configured to receive the first clock signal;

a twelfth transistor comprising a first terminal configured to receive the second clock signal, a second terminal coupled to the first input terminal of the chopper switch circuit, and a control terminal configured to receive the second clock signal;

a thirteenth transistor comprising a first terminal configured to receive the second clock signal, a second terminal coupled to the second input terminal of the chopper switch circuit, and a control terminal configured to receive the second clock signal; and a fourteenth transistor comprising a first terminal configured to receive the first clock signal, a second terminal configured to receive the second clock signal, and a control terminal configured to receive the first clock signal.

* * * * *